(12) United States Patent
Ioakeimidi et al.

(10) Patent No.: US 11,495,428 B2
(45) Date of Patent: Nov. 8, 2022

(54) PLASMONIC PHOTOCATHODE EMITTERS AT ULTRAVIOLET AND VISIBLE WAVELENGTHS

(71) Applicant: KLA CORPORATION, Milpitas, CA (US)

(72) Inventors: Katerina Ioakeimidi, San Francisco, CA (US); Gildardo R. Delgado, Livermore, CA (US); Frances Hill, Sunnyvale, CA (US); Gary V. Lopez Lopez, Sunnyvale, CA (US); Miguel A. Gonzalez, Livermore, CA (US); Alan D. Brodie, Palo Alto, CA (US)

(73) Assignee: KLA CORPORATION, Milpitas, CA (US)

( * ) Notice: Subject to any disclaimer, the term of this patent is extended or adjusted under 35 U.S.C. 154(b) by 349 days.

(21) Appl. No.: 16/789,650

(22) Filed: Feb. 13, 2020

(65) Prior Publication Data

US 2020/0266019 A1 Aug. 20, 2020

Related U.S. Application Data

(60) Provisional application No. 62/806,822, filed on Feb. 17, 2019.

(51) Int. Cl.
*H01J 1/34* (2006.01)
*H01J 37/317* (2006.01)
*G02B 5/00* (2006.01)

(52) U.S. Cl.
CPC ............... *H01J 1/34* (2013.01); *G02B 5/008* (2013.01); *H01J 37/3177* (2013.01); *H01J 2201/3423* (2013.01); *H01J 2201/3425* (2013.01)

(58) Field of Classification Search
CPC .......... H01J 2201/34–3428; H01J 1/34; H01J 29/385; G02B 5/008
See application file for complete search history.

(56) References Cited

U.S. PATENT DOCUMENTS

| | | | |
|---|---|---|---|
| 8,196,217 B2 | 6/2012 | Cheng et al. |
| 8,895,922 B2 | 11/2014 | Berney |
| 9,287,057 B2 | 3/2016 | Ng et al. |
| 9,984,846 B2 | 5/2018 | Schultz et al. |

(Continued)

FOREIGN PATENT DOCUMENTS

| | | |
|---|---|---|
| CN | 107275168 A | 10/2017 |
| CN | 108231507 A | 6/2018 |

(Continued)

OTHER PUBLICATIONS

Polyakov et al., Plasmon-Enhanced Photocathode for High Brightness and High Repetition Rate X-Ray Sources, Phys. Rev. Letters, vol. 110, 076802-1 to 076802-5 Feb. 2013.

(Continued)

*Primary Examiner* — Mariceli Santiago
(74) *Attorney, Agent, or Firm* — Hodgson Russ LLP

(57) ABSTRACT

A photocathode emitter can include a transparent substrate, a photocathode layer, and a plasmonic structure array disposed between the transparent substrate and the photocathode layer. The plasmonic structure can serve as a spot-confining structure and an electrical underlayer for biasing the photocathode. The plasmonic structure can confine the incident light at subwavelength sizes.

20 Claims, 9 Drawing Sheets

(56) References Cited

U.S. PATENT DOCUMENTS

| | | | |
|---|---|---|---|
| 10,074,509 | B2 | 9/2018 | Pan et al. |
| 11,217,416 | B2 * | 1/2022 | Belousov .................. H01J 1/34 |
| 2005/0264148 | A1 | 12/2005 | Maldonado et al. |
| 2005/0285128 | A1 | 12/2005 | Scherer et al. |
| 2010/0139771 | A1 | 6/2010 | Schwede et al. |
| 2011/0186863 | A1 | 8/2011 | Lee et al. |
| 2016/0203937 | A1 | 7/2016 | Sumant et al. |
| 2017/0076907 | A1 * | 3/2017 | Matsuki .................. G21K 5/04 |
| 2017/0133631 | A1 | 5/2017 | Thompson et al. |
| 2018/0174794 | A1 | 6/2018 | Delgado et al. |
| 2019/0108964 | A1 | 4/2019 | Ioakeimidi et al. |
| 2019/0108966 | A1 | 4/2019 | Delgado et al. |

FOREIGN PATENT DOCUMENTS

| | | | |
|---|---|---|---|
| CN | 108630510 A | 10/2018 | |
| JP | 2018077940 A | 5/2017 | |
| KR | 20120065641 A | 6/2012 | |
| WO | WO-0215223 A1 * | 2/2002 | ............. B82Y 10/00 |
| WO | WO-2018186294 A1 * | 10/2018 | ................ H01J 1/94 |

OTHER PUBLICATIONS

Khaleque et al., Integration of Bow-Tie Plasmonic Nano-Antennas on Tapered Fibers, Optics Express, vol. 25, No. 8, 8986-8996, Apr. 2017.

Cheng et al., Sub-15 nm Photo-Electron Source Using a Nano-Aperture Integrated with a Nano-Antenna, OSA/CLEO, 2011.

Du et al., Electrostatic Microcolumns for Surface Plasmon Enhanced Electron Beamlets, Proc. of SPIE, vol. 10346, 1034608-1 to 1034608-10, 2017.

Mimura et al., High Quantum Efficiency Photocathode Using Surface Plasmon Resonance, 27th Int'l Vacuum Nanoelectronics Conf., Jul. 2014.

Hobbs et al., High-Yield, Ultrafast, Surface Plasmon-Enhanced Au Nanorod Optical Field Electron Emitter Arrays, ACS Nano, abstract, 2014.

Lee et al., Optimization of a Plasmon Enhanced Field Emitter Array Using a Nano-Tip-Based Plasmonic Double-Gate Structure, J. of Lightwave Tech., vol. 34, No. 17, 4023-4027, Sep. 2016.

Siegmund et al., High Quantum Efficiency Opaque CsI Photocathodes for the Extreme and Far Ultraviolet, Proc. of SPIE, vol. 687, 117-124, 1986.

Gong et al., High-Brightness Plasmon-Enhanced Nanostructured Gold Photoemitter, Phys. Rev. Applied, vol. 2, 364012-1 to 064012-6, 2012.

Li et al., Surface-Plasmon Resonance-Enhanced Multiphoton Emission of High-Brightness Electron Beams from a Nanostructured Copper Cathode, Phys. Rev. Letters, vol. 110, abstract, 2013.

Vuckovic et al., Surface Plasmon Enhanced Light-Emitting Diode, J. of Quantum Electronics, vol. 36, No. 10, 1131-1144, Oct. 2000.

WIPO, ISR for PCT/US2020/018199, Jun. 12, 2020.

* cited by examiner

PLASMONIC PHOTOCATHODE EMITTERS AT ULTRAVIOLET AND VISIBLE WAVELENGTHS

CROSS-REFERENCE TO RELATED APPLICATIONS

This application claims priority to the provisional patent application filed Feb. 17, 2019 and assigned U.S. App. No. 62/806,822, the disclosure of which is hereby incorporated by reference.

FIELD OF THE DISCLOSURE

This disclosure relates to photocathode emitters.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer that are separated into individual semiconductor devices.

Electron beams are used in a number of different applications during semiconductor manufacturing. For example, electron beams can be modulated and directed onto an electron-sensitive resist on a semiconductor wafer, mask, or other workpiece to generate an electron pattern on the workpiece. Electron beams also can be used to inspect a wafer by, for example, detecting electrons emerging or reflected from the wafer to detect defects, anomalies, or undesirable objects.

These inspection processes are used at various steps during a semiconductor manufacturing process to promote higher yield in the manufacturing process and, thus, higher profits. Inspection has always been an important part of fabricating semiconductor devices such as integrated circuits (ICs). However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary because even relatively small defects may cause unwanted aberrations in the semiconductor devices.

Photocathodes have been used to generate electron beams. A single light beam incident on a photocathode system can generate a single electron beam with high brightness that is capable of delivering high electron current density. Planar photocathode structures can be used for applications such as illumination of accelerators, electron microscopy, lithography tools, or inspection tools. For the lithography tools or inspection tools, the photogenerated electron beams may need to be focused to a few nanometer size spots. Due to limitations of electron optics, the small spot requirement transfers to the initial spot size on the photocathode plane that may be limited to sub-wavelength values even for ultraviolet wavelengths.

Plasmonic structures with photocathodes were tried at the infrared wavelengths where the most common noble metals used for plasmonics, such as gold and silver, have high resonance. These structures show that plasmonic resonance can increase the quantum efficiency (QE) of photocathodes at visible or ultraviolet (120-700 nm) wavelengths. Although the QE increased, the final QE is relatively low even comparing to the QE of metals.

Improved photocathode emitters are needed.

BRIEF SUMMARY OF THE DISCLOSURE

A photocathode emitter is provided in a first embodiment. The photocathode emitter comprises a transparent substrate; a photocathode layer; and a plasmonic structure array disposed between the transparent substrate and the photocathode layer.

The photocathode layer can include one or more GaN, an alloy of Al(In)GaN(P), Cs(K)Te(Sb), CsI, or CsBr.

The transparent substrate can include one or more of ultraviolet fused silica, $CaF_2$, quartz, sapphire, $MgF_2$, or LiF.

The photocathode emitter can further include a cap layer disposed on a side of the photocathode layer opposite the plasmonic structure array. The cap layer can include ruthenium.

The plasmonic structure can include an array of a metallic material. The metallic material can be aluminum.

The photocathode emitter can further include a layer between the plasmonic structure array and the photocathode layer. The layer provides lattice matching between the plasmonic structure array and the photocathode layer.

The photocathode emitter can further include a doped wide bandgap semiconductor layer disposed on the plasmonic structure array opposite the photocathode layer. In an embodiment, the photocathode emitter can further include a negative electron affinity or a positive electron affinity material. In an embodiment, the photocathode emitter can further include one or more of Cs, CsBr, CsI, Ba, BaO, or Ba on a refractory oxide. In an embodiment, the photocathode emitter can further include a dopant, such as at least one of molybdenum or tungsten. The plasmonic structure can define a plurality of plasmonic cavities.

A method is provided in a second embodiment. The method comprises providing a photocathode. The photocathode includes a transparent substrate; a photocathode layer; and a plasmonic structure array disposed between the transparent substrate and the photocathode layer. A beam of light is directed at the photocathode and a beam of electrons is generated from the photocathode.

The photocathode can further include a cap layer disposed on a side of the photocathode layer opposite the plasmonic structure array.

The plasmonic structure can include an array of a metallic material.

The transparent substrate can include a doped wide bandgap semiconductor layer disposed on the plasmonic structure array opposite the photocathode layer. In an embodiment, the plasmonic structure defines a plurality of plasmonic cavities.

The photocathode can further include a layer between the plasmonic structure array and the photocathode layer. The layer provides lattice matching between the plasmonic structure array and the photocathode layer.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

To achieve small laser spots on the photocathode, embodiments disclosed herein use plasmonic structures of subwavelength dimensions. Metal plasmonic structures can serve as a spot-confining structure and an electrical underlayer for biasing the photocathode. The plasmonic structure can confine the incident light at subwavelength sizes (e.g., produce an electron beam of 100 nm diameter or less). The plasmonic structure also can have a strong resonance at visible and ultraviolet wavelengths to develop high brightness sources where several photocathodes, such as Cs$_2$Te, CsKTe, GaN, CsI, CsBr, or other materials, have high QE. The plasmonic structures can use metals or other materials that have strong plasmonic resonance at ultraviolet and visible wavelengths, such as aluminum.

Embodiments disclosed herein operate at wavelengths where photocathodes have high QE. Small spots are created to demonstrate high brightness emitters, which can be scalable to multiple electron beam arrangements.

In an embodiment, a plasmonic configuration attached to a photocathode in transmission mode operating at ultraviolet and visible wavelengths is disclosed. The structure can operate at wavelengths where the photocathode QE is maximum while enhancing the light transmission through plasmonic apertures to subwavelength spots. Tens of nAs per beam can be produced.

Figure 1:
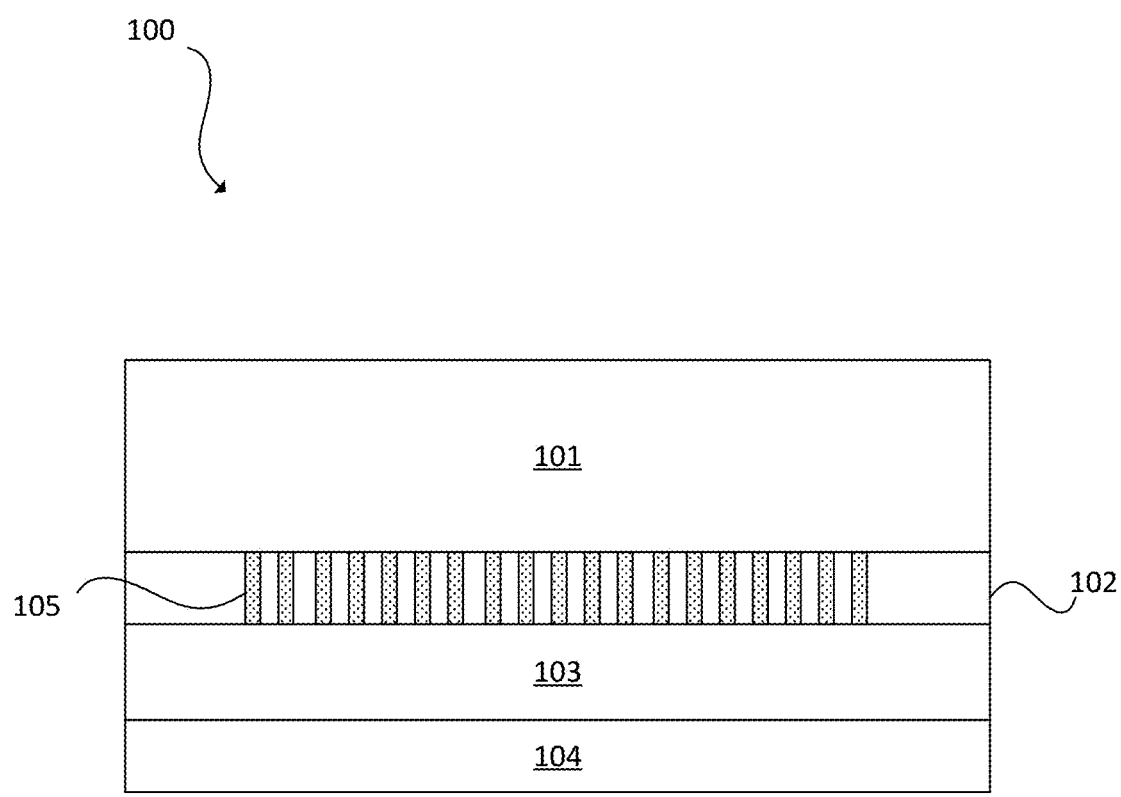
FIG. 1 is a cross-sectional view of a first embodiment of a photocathode in accordance with the present disclosure.

FIG. 1 is a cross-sectional view of a first embodiment of a photocathode 100. The photocathode 100 includes a transparent substrate 101, a photocathode layer 103, and a plasmonic structure array 102 disposed between the transparent substrate 101 and the photocathode layer 103. The photocathode layer 103 can include or otherwise be fabricated of one or more of GaN, an alloy of Al(In)GaN(P), Cs(K)Te(Sb), CsI, CsBr, or other materials. The transparent substrate 101 can include or otherwise be fabricated out of one or more of ultraviolet fused silica, CaF$_2$, quartz, sapphire, MgF$_2$, LiF, or other materials. The transparent substrate 101 can be transparent for ultraviolet and visible wavelengths. The photocathode layer 103 can have high QE at ultraviolet and visible wavelengths. The use of high QE photocathodes at wavelengths of maximum efficiency can provide an emitter with high brightness. A light source (not illustrated) can direct light at the photocathode 100, which will produce one or more electron beams.

The plasmonic structure 102 can include an array of metal material 105 (illustrated in FIG. 1 with the hatching). The metallic material 105 may be aluminum, metamaterials, or other materials. Light can impinge the metallic material 105 to create resonance. The metal material 105 can have strong resonance at ultraviolet and visible wavelengths. For example, strong resonance can correspond to a resonance peak.

The plasmonic structure 102 and metal material 105 can be scaled to a large number of electron beams with subwavelength spots suitable for high-throughput inspection systems.

The photocathode 100 can optionally include a cap layer 104 disposed on a side of the photocathode layer 103 opposite the plasmonic structure array 102. The cap layer 104 can include or otherwise be fabricated of ruthenium or other low work function metals. For example, the cap layer 104 can include a ruthenium alloy. The cap layer 104 can include a low work function metal for high lifetime operation.

Figure 9:
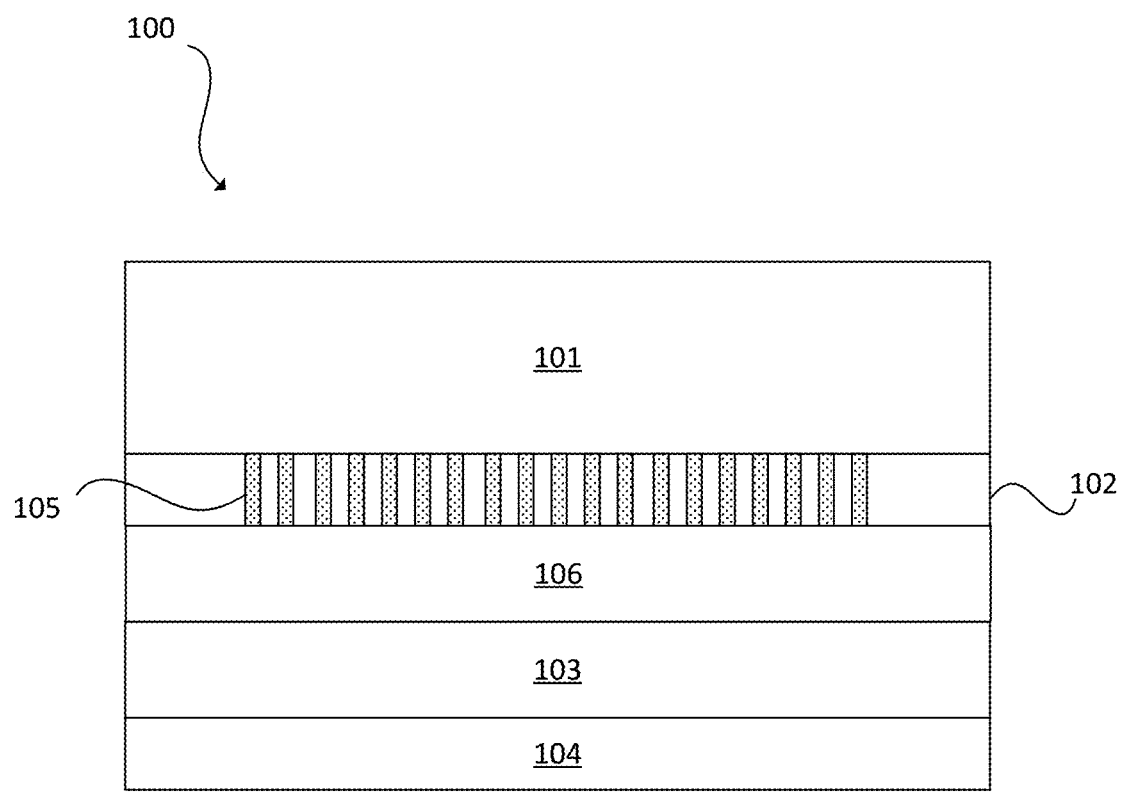
FIG. 9 is a cross-sectional view of a fourth embodiment of a photocathode in accordance with the present disclosure.

The photocathode 100 also can optionally include a layer between the plasmonic structure array 102 and the photocathode layer 103 (such as the layer 106 in FIG. 9) that provides lattice matching between the plasmonic structure array 102 and the photocathode layer 103. This can improve growth of the various layers in the photocathode 100. The layer between the plasmonic structure array 102 and the photocathode layer 103 can be thin enough to allow the plasmonic field to penetrate the photocathode layer 103 and thick enough to produce high-quality growth of the photocathode layer 103. For example, the optional layer may be a few nm in thickness. In an instance, a few nanometers of tapered AlGaN can be used to lattice match with a photocathode layer 103 that includes GaN.

Figure 2:
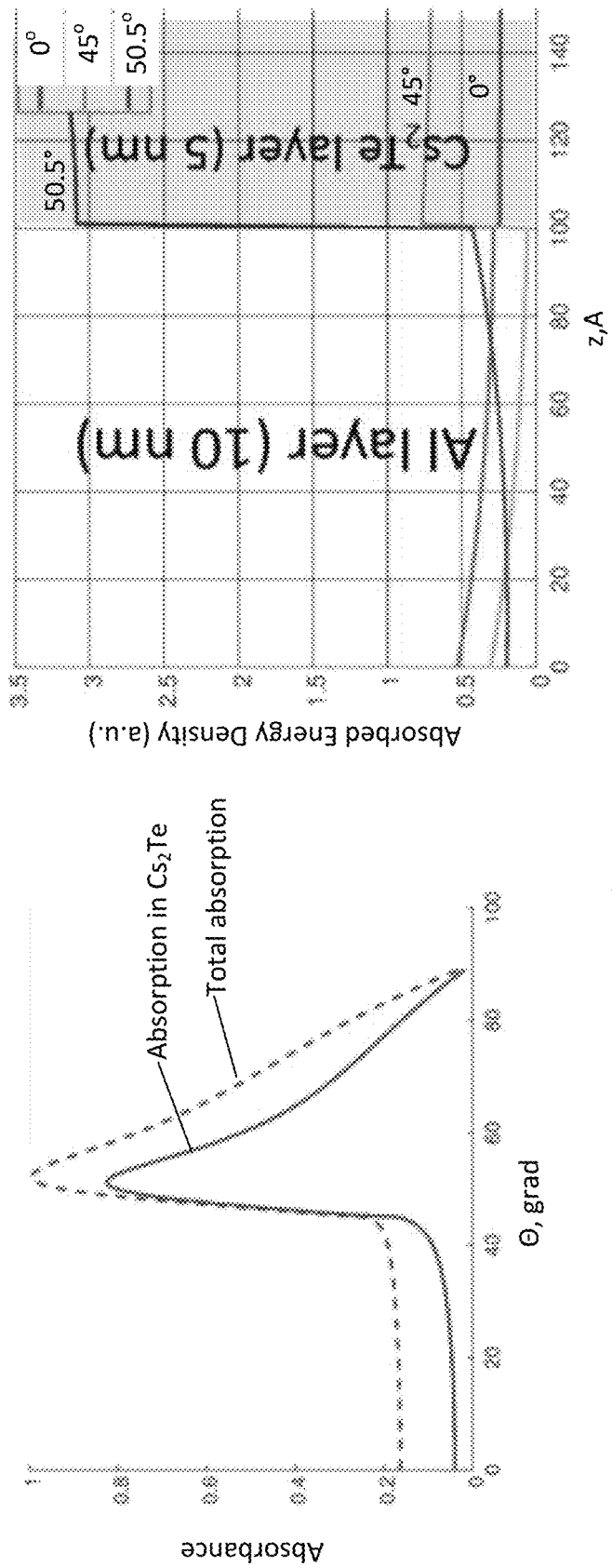
FIGS. 2-4 illustrate calculations for layer thickness optimization for an exemplary plasmonic Al/Cs$_2$Te photocathode.
Figure 3:
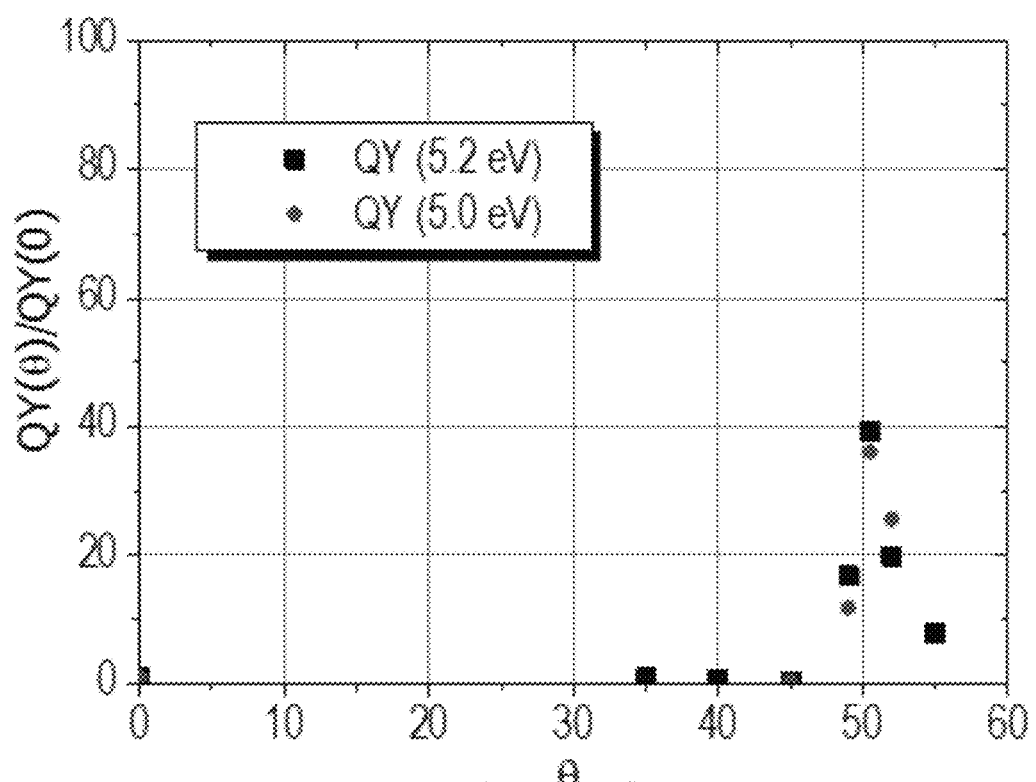
Figure 4:
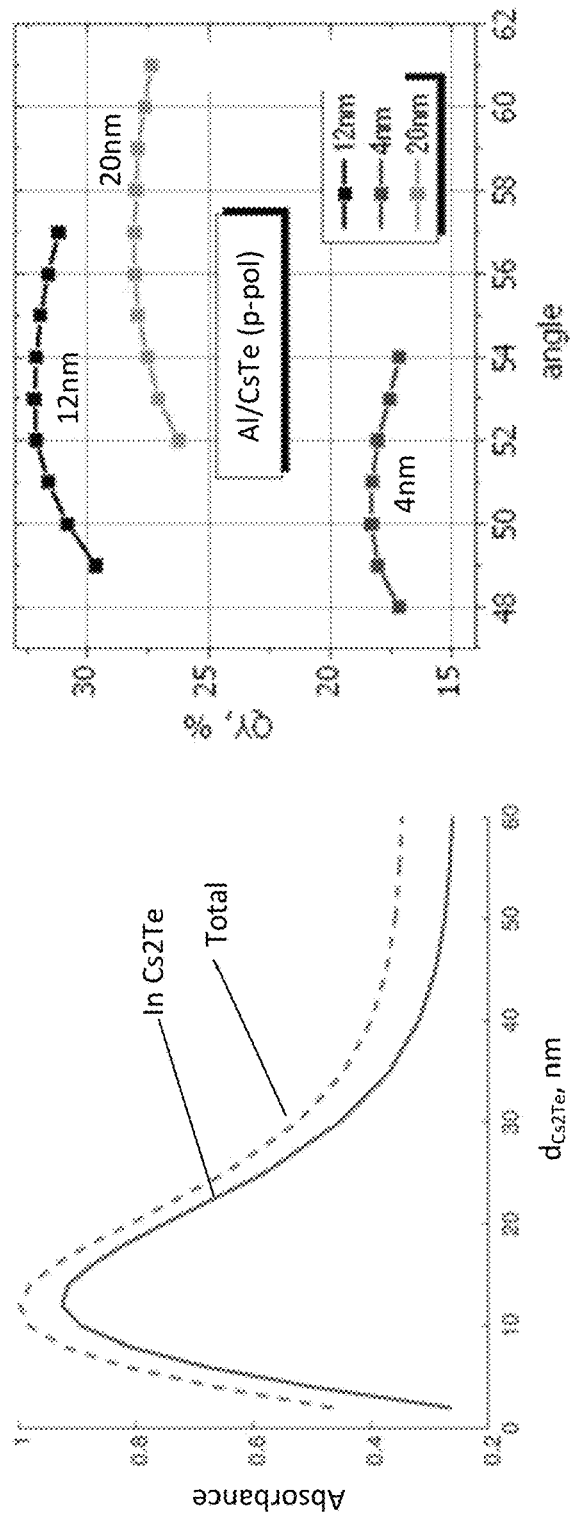

The thicknesses of the layers in the photocathode 100 can be optimized for optimal electron emission. For example, the thicknesses of the layers in the photocathode 100 can be optimized to absorb incident light and avoid excess electron scattering during transport to the surface, such as by monitoring a factor during growth. The exact thickness and plasmonic structure dimensions can depend on the photocathode material and wavelength used for photoelectron emission. For example, dimensions can be optimized with simulations to increase resonance, which can be wavelength and structure dependent. Additionally, the plasmonic structure dimensions can be optimized for the target spot size on the photocathode. An example of thickness optimization for an Al/Cs2Te plasmonic photocathode is shown in FIGS. 2-4.

For example, for a bullseye aperture geometry at 266 nm resonance, a glass substrate is at the bottom with a Cs$_2$Te layer on top. The light impinges from the substrate. In this example, the aluminum thickness (h) is 50 nm and the semiconductor thickness (hs) is 15 nm.

The brightness of the photocathode emitters disclosed herein can depend on the photocathode material and the excitation wavelength. The brightness is proportional to the total current and inversely proportional to the emittance of the photocathode material. The higher the quantum efficiency of the cathode, the higher the current for the same incident photon flux. There is usually a tradeoff between QE and emittance. Some cathodes, such as GaN, can achieve both high QE and low emittance. To achieve high brightness, two parameters may need to be optimized: low emittance or low transverse energy (e.g., 0.3 eV maximum) and high QE (>1 μA/mW) or total current.

In an instance, the transverse energy spread can achieve low emittance and small spots are obtained at the photocathode surface. To focus to a nanometer size electron beam spot, initial spots of approximately 100 nm may be required due to the limitations of electron optics.

However, most photocathodes suitable for inspection systems have low QE at infrared because infrared can involve a 2-4 photon photoemission process ($<10^{-5}$). As a result, only pAs of total current were achieved in previous efforts, which is not suitable for high-throughput multiple electron beam inspection systems.

The photocathode 100 can produce an array of sub-wavelength spot size electron beams of tens of nAs per electron beam. The photocathode 100 also can provide maximum transmission of light in sub-wavelength spots, which can provide high brightness. Brightness of the photocathode 100 may be higher than a thermal field emitter. Operation of the photocathode 100 can be at a value where high QE was demonstrated. QE is primarily absorption efficiency of the material at a certain wavelength minus the losses due to scattering and recombination of photogenerated electrons inside the material. Thus, optimization of thickness is typically performed.

Furthermore, the photocathode 100 can be scaled to a multi-beam system. The multi-beam system may only be limited by spatial constraints of the overall device.

QE is generally material-dependent as a function of wavelength. QE is primarily absorption efficiency of the material at a certain wavelength minus the losses due to scattering and recombination of photogenerated electrons inside the material. Thus, optimization of thickness may be performed.

Figure 5:
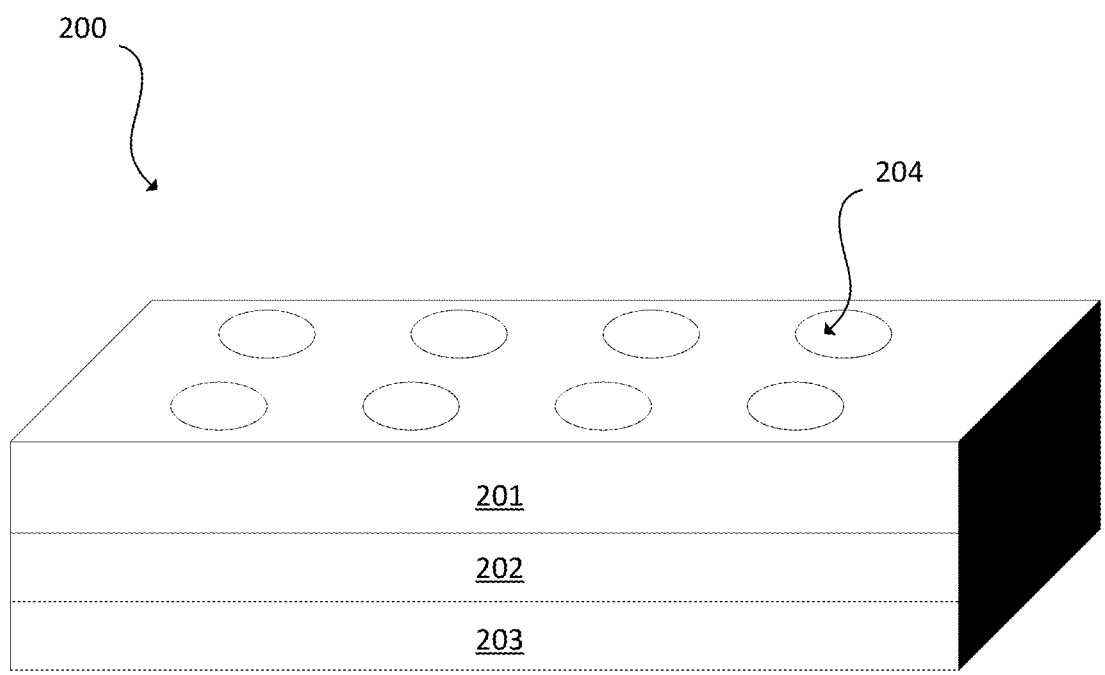
FIG. 5 is a perspective view of a second embodiment of a photocathode in accordance with the present disclosure.
Figure 6:
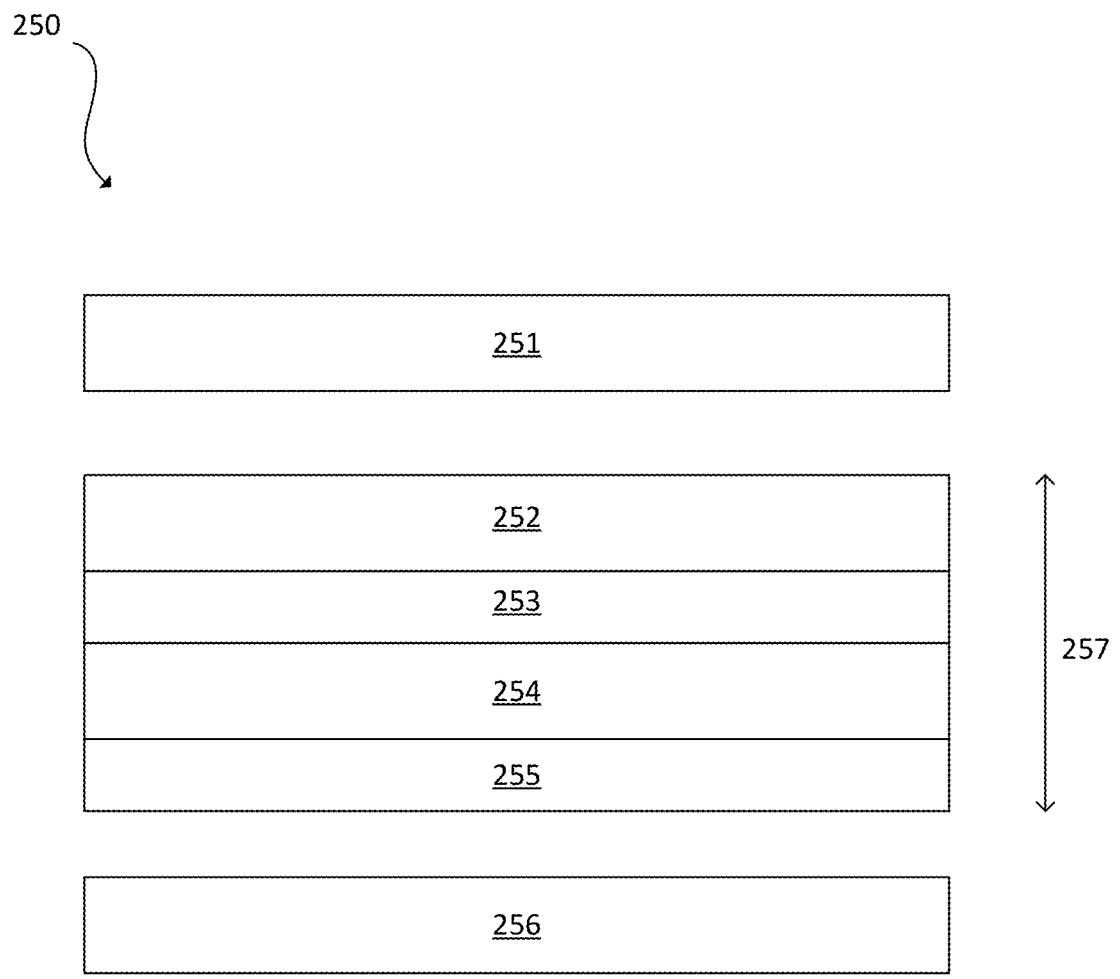
FIG. 6 is a perspective view of a third embodiment of a photocathode in accordance with the present disclosure.

FIG. 5 is a perspective view of a second embodiment of a photocathode and FIG. 6 is a perspective view of a third embodiment of a photocathode. These are variations of the photocathode 100 of FIG. 1. The photocathodes of FIGS. 5 and 6 are submicron arrayed low energy spread photocathode electron sources. The plasmonic structure of FIGS. 5 and 6 can increase the efficiency of light absorption by greater than 80%. Barium combined with a rare earth metal oxide can be used as part of the negative electron affinity (NEA) layer. A non-laminated structure of rare earth metal oxide and a suitable conductor can act as a doped insulating structure. For example, the metal oxide can be $Al_2O_3$ or $Sc_2O_3$. The dopant can be molybdenum or tungsten.

In FIG. 5, the photocathode 200 includes a low-temperature GaAs thin film 202 on a gold backplane 203. The sub-wavelength gold mesh 201 on the low-temperature GaAs thin film 202 has plasmonic cavities 204. The plasmonic cavities 204, which may be round or other shapes, extend through the sub-wavelength gold mesh 201 and can optionally extend into the low-T GaAs thin film 202. While gold and GaAs are disclosed, other materials can be used.

In FIG. 6, the photocathode 250 includes a doped wide bandgap semiconductor layer 254 disposed on the plasmonic structure array 253 opposite the photocathode layer 252. The plasmonic structure array 253 can have a plurality of plasmonic cavities, such as those seen in FIG. 5. The doped wide bandgap semiconductor layer 254 can includes a dopant such as molybdenum and/or tungsten.

The photocathode layer 252 can include an NEA or a positive electron affinity (PEA) material 252 as part of a transparent substrate 257. For example, the photocathode layer 252 can include or otherwise be fabricated of one or more of Cs, CsBr, CsI, Ba, BaO, or Ba on a refractory oxide. For example, the refractory oxide can be $Al_2O_3$ or $Sc_2O_3$.

A metal layer 255 may be disposed on the doped wide bandgap semiconductor layer 254. The metal layer 255 may be part of the plasmonic structure array 253 or made from the same material as the plasmonic structure array 253.

A thin film electron amplifier (e.g., diamond) 251 can optionally be positioned proximate or on the NEA layer 252. A light source 256 can direct light at either side of the photocathode 250.

The photocathode 200 of FIG. 5 may be part of the photocathode 250 of FIG. 6. Thus, the GaAs thin film 202 can be an example of the doped wide bandgap semiconductor layer 254, the sub-wavelength gold mesh 201 can be an example of the plasmonic structure array 253, and the gold backplane 203 can be an example of the metal layer 255.

The photocathode 200 and photocathode 250 provide improved efficiency because of the additional light absorption and supply of electrons through the doped nano-laminate, and longer lifetimes due to the higher stability of Ba and BaO. The photocathode 200 and photocathode 250 can provide a multi-electron beam system with greater than twenty electron beams.

The photocathode 250 uses the plasmonic structure array 253 to increase the efficiency of light capture. The NEA or PEA material 252 is used to lower the surface work function so electrons can leave the material and enter the vacuum. A nano-laminate (e.g., doping of the insulators/wide bandgap semiconductors) can be used to create interstitial states within the doped wide bandgap semiconductor layer 254 to lower the amount of energy required for photoemission. The nano-laminate also can increase the conductivity of the doped wide bandgap semiconductor layer 254 to improve electron transport. The metal layer 255 can be part of the plasmonic light trap. The light source 256 is used for illumination and the optional electron amplifier 251 can be used to increase the total electron yield.

The photocathode 250 can be made by atomic layer deposition (ALD) that uses $Sc_2O_3$ and tungsten or molybdenum nanoparticles as a conduction path for the electrons. The use of barium to form BaO on the surface can lower the surface work function.

Figure 7:
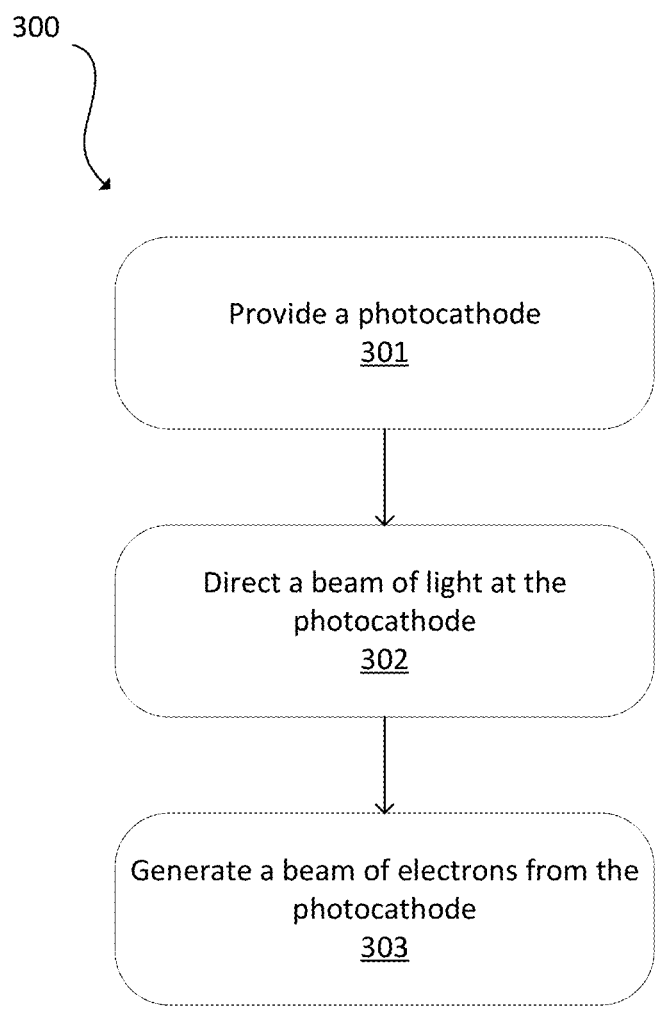
FIG. 7 is a flowchart of a method in accordance with the present disclosure.

FIG. 7 is a flowchart of a method 300. A photocathode is provided at 301, such as one of the photocathode embodiments disclosed herein. The photocathode can include a transparent substrate, a photocathode layer, and a plasmonic structure array disposed between the transparent substrate and the photocathode layer.

A beam of light is directed at the photocathode at 302. A beam of electrons is generated from the photocathode at 303.

The photocathode in method 300 can further include a cap layer disposed on a side of the photocathode layer opposite the plasmonic structure array.

The plasmonic structure in the method 300 can include an array of a metallic material.

The transparent substrate in the method 300 can include a doped wide bandgap semiconductor layer disposed on the plasmonic structure array opposite the photocathode layer. The plasmonic structure can define a plurality of plasmonic cavities.

The photocathode in the method 300 can further include a layer between the plasmonic structure array and the photocathode layer. The layer provides lattice matching between the plasmonic structure array and the photocathode layer.

Figure 8:
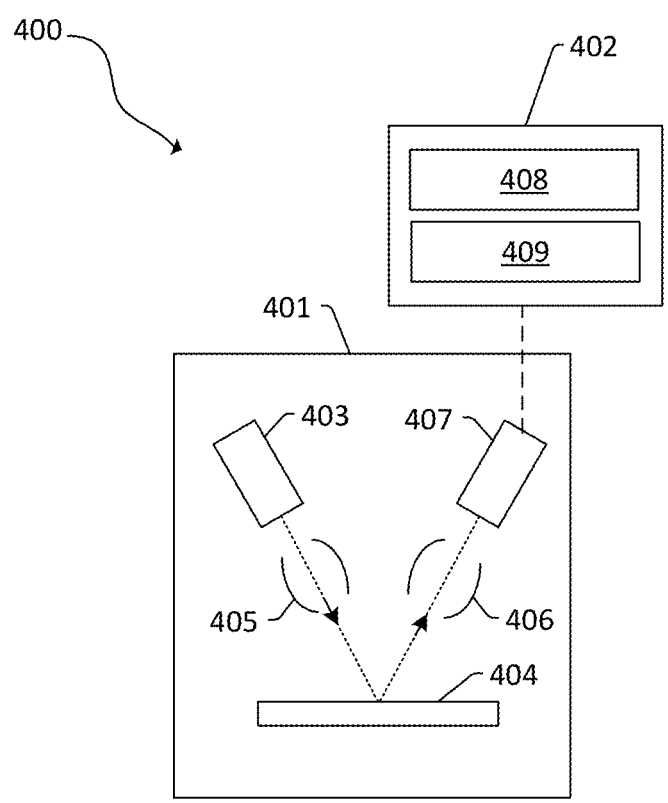
FIG. 8 is a block diagram of an embodiment of a system in accordance with the present disclosure.

FIG. 8 is a block diagram of an embodiment of a system 400. The system 400 includes a wafer inspection tool (which includes the electron column 401) configured to generate images of a wafer 404.

The wafer inspection tool includes an output acquisition subsystem that includes at least an energy source and a detector. The output acquisition subsystem may be an electron beam-based output acquisition subsystem. For example, in one embodiment, the energy directed to the wafer 404 includes electrons, and the energy detected from the wafer 404 includes electrons. In this manner, the energy source may be an electron beam source. In one such embodiment shown in FIG. 8, the output acquisition subsystem includes electron column 401, which is coupled to computer subsystem 402. A chuck (not illustrated) may hold the wafer 404.

As also shown in FIG. 8, the electron column 401 includes an electron beam source 403 configured to generate electrons that are focused to wafer 404 by one or more elements 405. The electron beam source 403 may include, for example, an embodiment of the photocathode 100 of FIG. 1, the photocathode 200 of FIG. 5, or the photocathode 250 of FIG. 6. The one or more elements 405 may include, for example, a gun lens, an anode, a beam limiting aperture, a gate valve, a beam current selection aperture, an objective lens, and a scanning subsystem, all of which may include any such suitable elements known in the art.

Electrons returned from the wafer 404 (e.g., secondary electrons) may be focused by one or more elements 406 to detector 407. One or more elements 406 may include, for example, a scanning subsystem, which may be the same scanning subsystem included in element(s) 405.

The electron column also may include any other suitable elements known in the art.

Although the electron column 401 is shown in FIG. 8 as being configured such that the electrons are directed to the wafer 404 at an oblique angle of incidence and are scattered from the wafer 404 at another oblique angle, the electron beam may be directed to and scattered from the wafer 404 at any suitable angles. In addition, the electron beam-based output acquisition subsystem may be configured to use multiple modes to generate images of the wafer 404 (e.g., with different illumination angles, collection angles, etc.). The multiple modes of the electron beam-based output acquisition subsystem may be different in any image generation parameters of the output acquisition subsystem.

Computer subsystem 402 may be coupled to detector 407 such that the computer subsystem 402 is in electronic communication with the detector 407 or other components of the wafer inspection tool. The detector 407 may detect electrons returned from the surface of the wafer 404 thereby forming electron beam images of the wafer 404 with the computer subsystem 402. The electron beam images may include any suitable electron beam images. The computer subsystem 402 includes a processor 408 and an electronic data storage unit 409. The processor 408 may include a microprocessor, a microcontroller, or other devices.

It is noted that FIG. 8 is provided herein to generally illustrate a configuration of an electron beam-based output acquisition subsystem that may be used in the embodiments described herein. The electron beam-based output acquisition subsystem configuration described herein may be altered to optimize the performance of the output acquisition subsystem as is normally performed when designing a commercial output acquisition system. In addition, the systems described herein may be implemented using an existing system (e.g., by adding functionality described herein to an existing system). For some such systems, the methods described herein may be provided as optional functionality of the system (e.g., in addition to other functionality of the system). Alternatively, the system described herein may be designed as a completely new system.

The computer subsystem 402 may be coupled to the components of the system 400 in any suitable manner (e.g., via one or more transmission media, which may include wired and/or wireless transmission media) such that the processor 408 can receive output. The processor 408 may be configured to perform a number of functions using the output. The wafer inspection tool can receive instructions or other information from the processor 408. The processor 408 and/or the electronic data storage unit 409 optionally may be in electronic communication with another wafer inspection tool, a wafer metrology tool, or a wafer review tool (not illustrated) to receive additional information or send instructions.

The computer subsystem 402, other system(s), or other subsystem(s) described herein may be part of various systems, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high speed processing and software, either as a standalone or a networked tool.

The processor 408 and electronic data storage unit 409 may be disposed in or otherwise part of the system 400 or another device. In an example, the processor 408 and electronic data storage unit 409 may be part of a standalone control unit or in a centralized quality control unit. Multiple processors 408 or electronic data storage unit 409 may be used.

The processor 408 may be implemented in practice by any combination of hardware, software, and firmware. Also, its functions as described herein may be performed by one unit, or divided up among different components, each of which may be implemented in turn by any combination of hardware, software, and firmware. Program code or instructions for the processor 408 to implement various methods and functions may be stored in readable storage media, such as a memory in the electronic data storage unit 409 or other memory.

The system 400 of FIG. 8 is merely one example of a system that can use embodiments of the electron source 100 or embodiments of the method 250. The system 400 can operate at an ultra-high vacuum (UHV) environment or other environments. Embodiments of the electron source 100 may be part of a defect review system, an inspection system, a metrology system, or some other type of system. Thus, the embodiments disclosed herein describe some configurations that can be tailored in a number of manners for systems having different capabilities that are more or less suitable for different applications.

Photocathode embodiments disclosed here can be used in reticle and wafer inspection systems; electron beam inspection systems for wafers or reticles using single or multiple electron sources; electron beam review systems for wafers or reticles using single or multiple electron sources; or electron beam metrology systems for wafers or reticles using single or multiple electron sources. Photocathode embodiments disclosed herein also can be used in systems that use electron sources to generate x-rays using single or multiple electron sources, such as those for metrology, review, or inspection of a wafer or reticle. For example, embodiments disclosed herein can be used in a multi-electron source inspection system or lithography system.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A photocathode emitter comprising:
    a transparent substrate;
    a photocathode layer;
    a plasmonic structure array disposed between the transparent substrate and the photocathode layer; and
    a cap layer disposed on a side of the photocathode layer opposite the plasmonic structure array, wherein the cap layer includes ruthenium.

2. The photocathode emitter of claim 1, wherein the photocathode layer includes one or more of GaN, an alloy of Al(In)GaN(P), Cs(K)Te(Sb), CsI, or CsBr.

3. The photocathode emitter of claim 1, wherein the transparent substrate includes one or more of ultraviolet fused silica, $CaF_2$, quartz, sapphire, $MgF_2$, or LiF.

4. The photocathode emitter of claim 1, wherein the plasmonic structure includes an array of a metallic material.

5. The photocathode emitter of claim 4, wherein the metallic material is aluminum.

6. The photocathode emitter of claim 1, further comprising a layer between the plasmonic structure array and the photocathode layer, wherein the layer provides lattice matching between the plasmonic structure array and the photocathode layer.

7. A method comprising:
    providing a photocathode, wherein the photocathode includes:
        a transparent substrate;
        a photocathode layer;
        a plasmonic structure array disposed between the transparent substrate and the photocathode layer; and
        a cap layer disposed on a side of the photocathode layer opposite the plasmonic structure array, wherein the cap layer includes ruthenium
    directing a beam of light at the photocathode; and
    generating a beam of electrons from the photocathode.

8. The method of claim 7, wherein the plasmonic structure includes an array of a metallic material.

9. The method of claim 7, wherein the photocathode further includes a layer between the plasmonic structure array and the photocathode layer, wherein the layer provides lattice matching between the plasmonic structure array and the photocathode layer.

10. A photocathode emitter comprising:
    a transparent substrate;
    a photocathode layer;
    a plasmonic structure array disposed between the transparent substrate and the photocathode layer; and
    a doped wide bandgap semiconductor layer disposed on the plasmonic structure array opposite the photocathode layer.

11. The photocathode emitter of claim 10, wherein the transparent substrate includes one or more of ultraviolet fused silica, $CaF_2$, quartz, sapphire, $MgF_2$, or LiF.

12. The photocathode emitter of claim 10, wherein the photocathode layer includes a negative electron affinity or a positive electron affinity material.

13. The photocathode emitter of claim 12, wherein the photocathode layer includes one or more of Cs, CsBr, CsI, Ba, BaO, or Ba on a refractory oxide.

14. The photocathode emitter of claim 10, wherein the doped wide bandgap semiconductor layer includes a dopant, wherein the dopant is at least one of molybdenum or tungsten.

15. The photocathode emitter of claim 10, wherein the plasmonic structure defines a plurality of plasmonic cavities.

16. A photocathode emitter comprising:
    a transparent substrate;
    a photocathode layer;
    a plasmonic structure array disposed between the transparent substrate and the photocathode layer; and
    a layer between the plasmonic structure array and the photocathode layer, wherein the layer provides lattice matching between the plasmonic structure array and the photocathode layer.

17. The photocathode emitter of claim 16, wherein the photocathode layer includes one or more of GaN, an alloy of Al(In)GaN(P), Cs(K)Te(Sb), CsI, or CsBr.

18. The photocathode emitter of claim 16, wherein the transparent substrate includes one or more of ultraviolet fused silica, $CaF_2$, quartz, sapphire, $MgF_2$, or LiF.

19. The photocathode emitter of claim 16, wherein the plasmonic structure includes an array of a metallic material.

20. The photocathode emitter of claim 19, wherein the metallic material is aluminum.

* * * * *